(12) United States Patent
Khang

(10) Patent No.: US 7,288,294 B2
(45) Date of Patent: Oct. 30, 2007

(54) METHOD OF CRYSTALLIZING AMORPHOUS SILICON USING NANOPARTICLES

(75) Inventor: Yoon-ho Khang, Seoul (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 437 days.

(21) Appl. No.: 10/417,148

(22) Filed: Apr. 17, 2003

(65) Prior Publication Data

US 2003/0226820 A1 Dec. 11, 2003

(30) Foreign Application Priority Data

Jun. 5, 2002 (KR) .............................. 2002-31728

(51) Int. Cl.
*C30B 30/00* (2006.01)
*B05D 3/06* (2006.01)
*C30B 13/08* (2006.01)

(52) U.S. Cl. ...................... 427/554; 427/553; 427/596; 427/189; 427/197; 427/199; 438/798; 438/487

(58) Field of Classification Search .................... None
See application file for complete search history.

(56) References Cited

U.S. PATENT DOCUMENTS

| | | | | |
|---|---|---|---|---|
| 5,304,357 A * | 4/1994 | Sato et al. ................. 118/50.1 |
| 5,585,020 A | 12/1996 | Becker et al. .......... 219/121.85 |
| 5,830,538 A | 11/1998 | Gates et al. |
| 6,194,023 B1 | 2/2001 | Mitsuhashi et al. |
| 6,255,148 B1 | 7/2001 | Hara et al. |
| 6,852,609 B2 * | 2/2005 | Yang ........................... 438/487 |
| 7,074,728 B2 * | 7/2006 | Jang et al. .................. 438/795 |
| 7,109,073 B2 * | 9/2006 | Yamazaki .................... 438/150 |
| 7,115,487 B2 * | 10/2006 | Kumomi et al. ............ 438/486 |
| 7,195,992 B2 * | 3/2007 | Gu et al. ..................... 438/487 |
| 2001/0041391 A1 | 11/2001 | Hara et al. |
| 2003/0199177 A1 * | 10/2003 | Hartzell ....................... 438/795 |
| 2007/0105352 A1 * | 5/2007 | Gu et al. ..................... 438/487 |

FOREIGN PATENT DOCUMENTS

| | | | | |
|---|---|---|---|---|
| JP | 61-163110 | * | 7/1986 | .................. 427/75 |
| JP | 2-188499 | | 7/1990 | |
| JP | 3-178124 | | 2/1991 | |
| JP | 4-219392 | * | 8/1992 | .................. 117/73 |
| JP | 10-289876 | * | 10/1998 | |
| KR | 1999-0060890 | | 7/1999 | |
| KR | 2001-0007728 | | 2/2001 | |

OTHER PUBLICATIONS

Derwent-Acc-No. 2005-092652(Derwent-week:200511), abstract of CN 1536619 A, published Oct. 13, 2004 to Weng et al.*
Webster's Ninth New Collegiate Dictionary, Merriam-Webster's Inc., USA, 1990 (no month), excerpt p. 632.*

* cited by examiner

*Primary Examiner*—Marianne Padgett
(74) *Attorney, Agent, or Firm*—Lee & Morse, P.C.

(57) ABSTRACT

A method of crystallizing amorphous silicon, wherein the method includes supplying nanoparticles over a surface of an amorphous silicon layer; intermittently melting nanoparticles that reach the surface of the amorphous silicon layer while supplying the nanoparticles; and cooling the amorphous silicon layer to grow crystals using unmolten nanoparticles as crystal seeds, thereby forming a polysilicon layer. Externally supplied nanoparticles are used as crystal seeds to crystallize an amorphous silicon layer so that large grains can be formed. Accordingly, since the number and size of nanoparticles may be controlled, the size and arrangement of grains may also be controlled.

25 Claims, 4 Drawing Sheets

(a)  (b)

(c)  (d)

(e)  (f)

METHOD OF CRYSTALLIZING AMORPHOUS SILICON USING NANOPARTICLES

BACKGROUND OF THE INVENTION

1. Field of the Invention

The present invention relates to a method of crystallizing amorphous silicon. More particularly, the present invention relates to a method of crystallizing amorphous silicon using nanoparticles.

2. Description of the Related Art

Crystallization of amorphous silicon into polysilicon is essential to the formation of a high-performance thin film transistor (TFT) on a glass or plastic substrate. Use of this technology is essential in this regard because polysilicon has an electron mobility that is significantly higher than that of amorphous silicon and is thus used to form a driving circuit or a TFT on a glass substrate used as a substrate of a flat display, such as a liquid crystal display.

Among many conventional methods of crystallizing amorphous silicon into polysilicon, the most widely used method is an excimer laser annealing method, as illustrated in FIG. 1.

In the excimer laser annealing method, after amorphous silicon is deposited on a substrate, an excimer laser beam is radiated at the substrate to melt the amorphous silicon, thereby crystallizing the amorphous silicon. In this conventional method, the amount of molten amorphous silicon and a state of crystallization vary with the power of a laser beam, as shown in FIG. 1.

FIGS. 1(a) and 1(b), when the power of a laser beam is near threshold energy, only a small amount of amorphous silicon acts as a crystal seed. In FIG. 1(a), the power of a laser beam is appropriately adjusted to be nearly equal to a threshold energy density so that most of an amorphous silicon layer 13 on a substrate 11 is molten and only a small amount of unmolten amorphous silicon 15a acts as a crystal seed. In FIG. 1(b), the molten amorphous silicon layer 13 is gradually cooled around the unmolten amorphous silicon 15a and grows into ideal grains.

In FIGS. 1(c) and 1(d), at a power lower than the threshold energy, only a top surface of the amorphous silicon layer 13 is molten and is then cooled so that the amorphous silicon layer 13 grows into small grains. As shown in FIG. 1(c), when the power of a laser beam is lower than the threshold energy density, only the top surface of the amorphous silicon layer 13 is molten, and the amorphous silicon layer 13 near the substrate 11 remains without being molten 15b. Accordingly, when the amorphous silicon layer 13 is cooled, nonuniform grains are formed, as shown in FIG. 1(d).

In FIGS. 1(e) and 1(f), at a power higher than the threshold energy, the amorphous silicon layer 13 is completely molten so that no amorphous silicon remains to act as a crystal seed. Accordingly, seeds are generated nonuniformly and crystals grow nonuniformly. When the power of a laser beam is higher than the threshold energy density, the amorphous silicon layer 13 is completely molten as shown in FIG. 1(e). When it is cooled, crystals grow nonuniformly and the size of grains decreases, as shown in FIG. 1(f).

Consequently, in the conventional laser annealing technology, the power of a laser beam must be as near as possible to a threshold energy density so that a proper amount of amorphous silicon, which can act as a crystal seed, will remain. It is difficult, however, to adjust the energy density of a laser beam accurately and to control the number of crystal seeds and the size and arrangement thereof. Accordingly, grains are too small and grow nonuniformly.

SUMMARY OF THE INVENTION

In an effort to solve the above-described problems, it is a feature of an embodiment of the present invention to provide a method of crystallizing amorphous silicon, through which the number, size and arrangement of crystal seeds are adjusted so that large grains are able to grow uniformly.

To provide the above feature of an embodiment of the present invention, there is provided a method of crystallizing amorphous silicon. The method includes supplying nanoparticles over a surface of an amorphous silicon layer; intermittently melting nanoparticles that reach the surface of the amorphous silicon layer while supplying the nanoparticles; and cooling the amorphous silicon layer to grow crystals using unmolten nanoparticles as crystal seeds, thereby forming a polysilicon layer.

Preferably, the melting of nanoparticles includes intermittently melting the amorphous silicon layer and the nanoparticles by radiating a laser beam having a pulse waveform at the surface of the amorphous silicon layer.

Preferably, the crystals have a ring-shape and are formed centering on the crystal seeds.

Preferably, the method further includes removing nanoparticles that do not act as crystal seeds on the surface of the amorphous silicon layer after cooling the amorphous silicon layer.

The removing of nanoparticles may include oxidizing the nanoparticles and the surface of the polysilicon layer and etching them. Alternatively, the removing of nanoparticles may include performing sputtering on the surface of the polysilicon layer.

Since silicon nanoparticles acting as crystal seeds are externally provided over the surface of the amorphous silicon layer, the number and size of crystal seeds can be controlled so that large grains may be grown to form an ideal polysilicon layer.

BRIEF DESCRIPTION OF THE DRAWINGS

The above and other features and advantages of the present invention will become readily apparent to those of ordinary skill in the art by describing in detail a preferred embodiment thereof with reference to the attached drawings in which.

DETAILED DESCRIPTION OF THE INVENTION

Korean Patent Application No. 2002-31728, filed Jun. 5, 2002, and entitled: "Method of Crystallizing Amorphous Silicon Using Nanoparticles," is incorporated by reference herein in its entirety.

Hereinafter, a method of crystallizing amorphous silicon according to an embodiment of the present invention will be described in detail with reference to the attached drawings.

Figure 1:
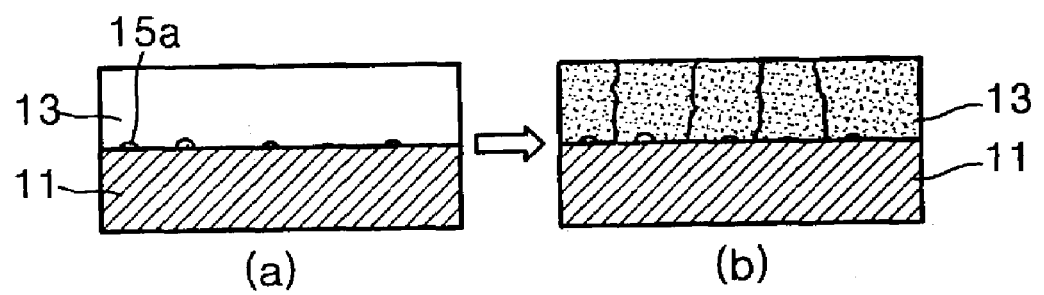
FIG. 1 illustrates a schematic diagram of a conventional method of crystallizing amorphous silicon.
Figure 1:
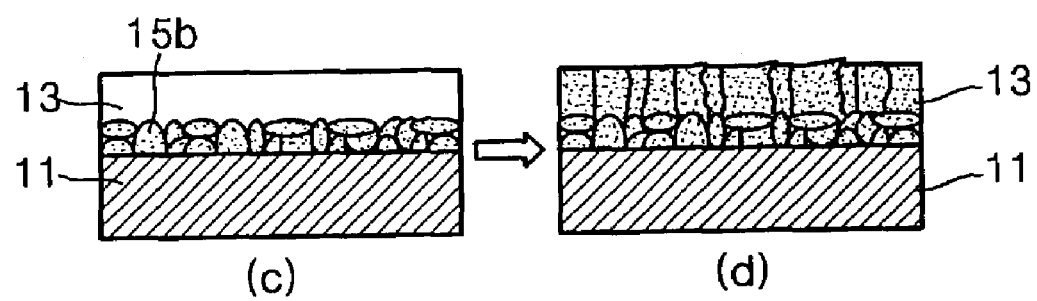
Figure 1:
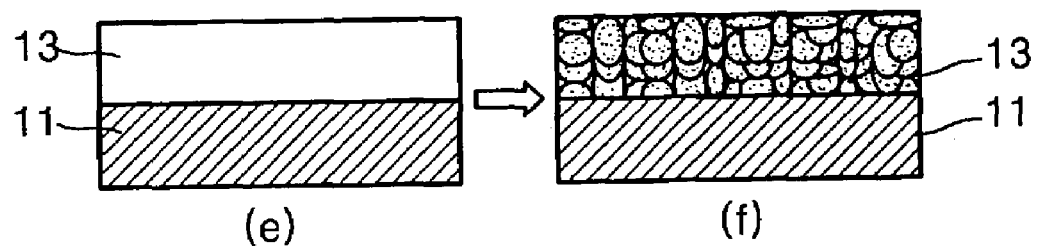
Figure 2A:
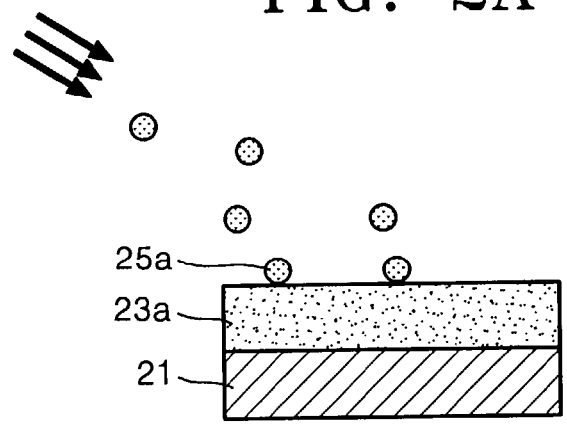
FIGS. 2A through 2C illustrate steps in a method of crystallizing amorphous silicon according to an embodiment of the present invention.
Figure 2B:
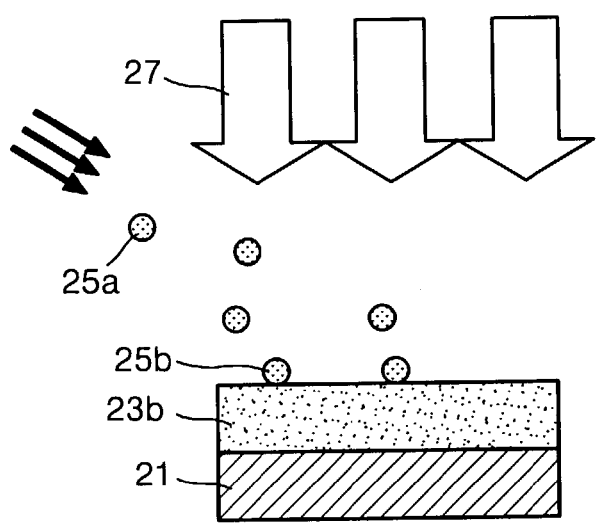
Figure 2C:
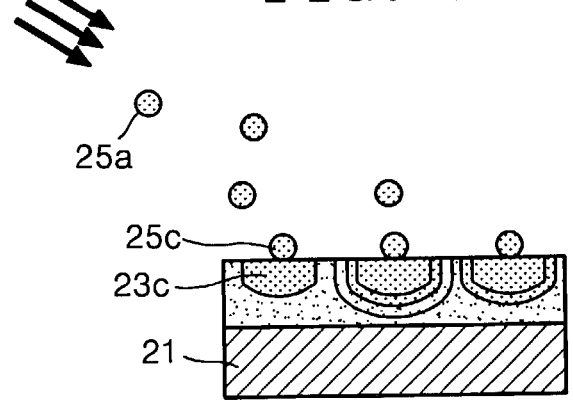

FIGS. 2A through 2C illustrate steps in a method of crystallizing amorphous silicon according to an embodiment of the present invention. In order to crystallize amorphous silicon, as shown in FIG. 2A, nanoparticles 25a are supplied over a surface of an amorphous silicon layer 23a that is deposited on a surface of a substrate 21. Various kinds of nanoparticles 25a, including silicon monocrystals, may be used.

Either a glass or plastic substrate is preferably used as the substrate 21. The amorphous silicon layer 23a is formed to a thickness of several angstroms through several thousands of angstroms, and preferably a thickness of 1000 Å.

Figure 5:
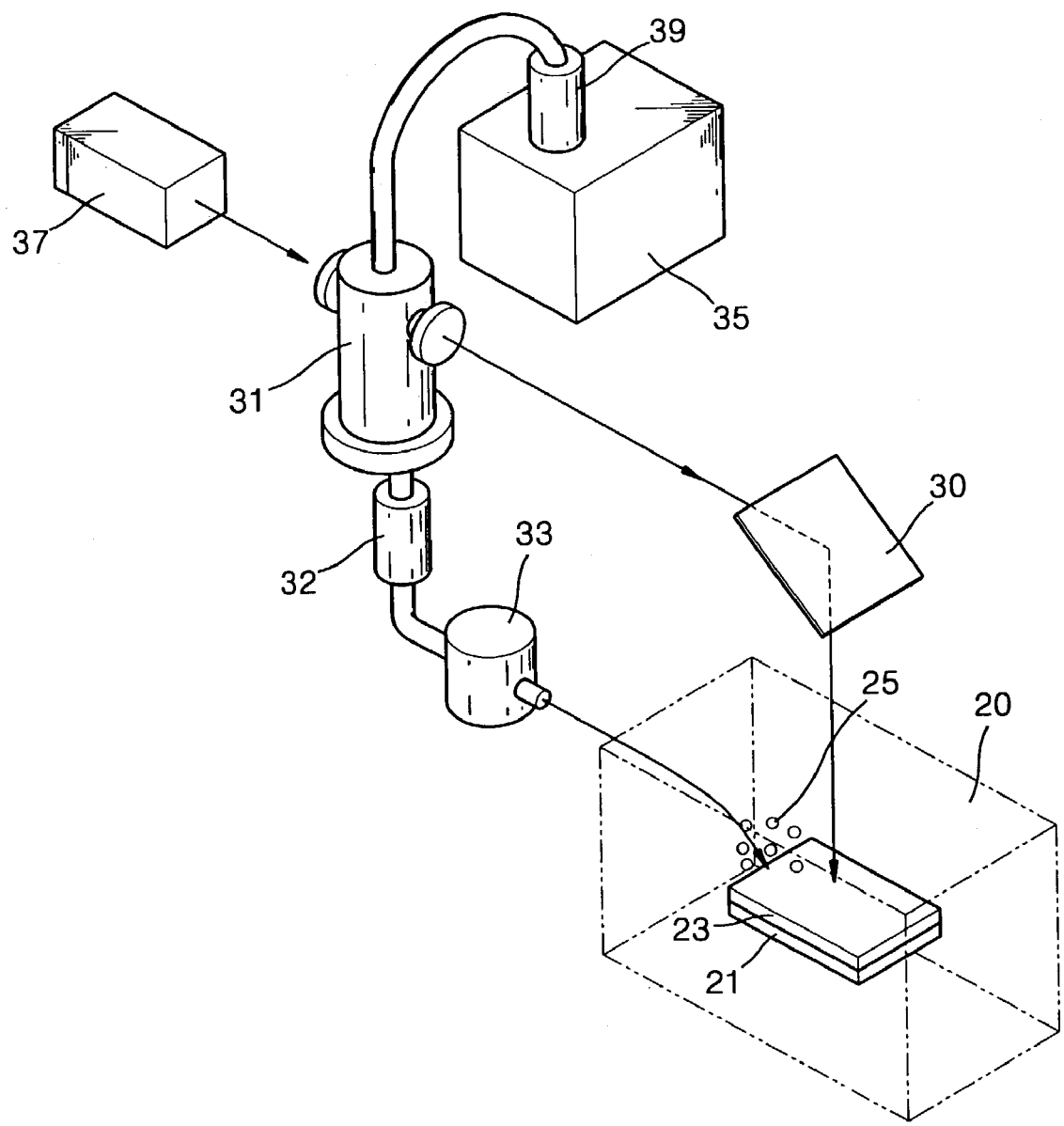
FIG. 5 illustrates a perspective projection of an apparatus used to perform the method of crystallizing amorphous silicon according to an embodiment of the present invention.

In order to form the nanoparticles 25a, aerosol laser ablation or pyrolysis may be used. FIG. 5 illustrates an exemplary apparatus for performing aerosol laser ablation for forming nanoparticles 25.

Referring to FIG. 5, an aerosol laser ablation apparatus includes an aerosol generator 35 for generating aerosol from silicon powder having a micron size; an excimer laser 37 for radiating a laser beam at the aerosol; an ablation chamber 31 for radiating the excimer laser beam having a pulse waveform at the silicon powder flowing from the aerosol generator 35 to form the nanoparticles 25; and a size sorter 33 for passing only the nanoparticles 25 that have a predetermined size and supplying them to a reaction container 20.

In FIG. 5, reference numeral 32 denotes an impactor for sorting nanoparticles having a size of several hundreds of nanometers or greater using a difference in movement among nanoparticles according to their size. Reference numeral 39 denotes a neutralizer for electrifying silicon powder or the nanoparticles 25 using radioactive rays in order to prevent the silicon powder or nanoparticles 25 from adhering to the inner wall of a pipe or for precisely sorting the nanoparticles 25 by size.

A carrier gas for the nanoparticles 25 may be helium (He) gas, nitrogen ($N_2$) gas, or argon (Ar) gas. The nanoparticles 25 have a size of several nanometers through several tens of nanometers.

In the step shown in FIG. 2B, while the nanoparticles 25a are supplied, a laser beam 27 having a pulse waveform is radiated at the surface of an amorphous silicon layer 23b to intermittently melt the amorphous silicon layer 23b and nanoparticles 25b that reach the surface of the amorphous silicon layer 23b.

The nanoparticles 25b, which reach the surface of the amorphous silicon layer 23b while the laser beam 27 is radiated, are molten together with the amorphous silicon layer 23b. However, nanoparticles 25c, which reach the amorphous silicon layer 23b while the laser beam 27 is not radiated, are not molten and act as crystal seeds for forming a polysilicon layer, as shown in FIG. 2C. Here, the laser beam 27 that is radiated to melt the amorphous silicon layer 23b is emitted from the excimer laser 37, and then a path thereof is converted by a mirror 30 so that it is incident into the reaction container 20, as shown in FIG. 5.

After radiation of the laser beam 27 is completed, the amorphous silicon layer 23b is cooled so that crystals grow using the unmolten nanoparticles 25c as crystal seeds, thereby forming a polysilicon layer 23c, as shown in FIG. 2C. Here, the size of grains is determined according to correlation among the density of nanoparticles 25a, crystallization speed, cooling speed of a thin film, and other characteristics.

The nanoparticles 25a that reach the surface of the thin film after being cooled do not contribute to crystallization and remain as protruding particles on the surface. In order to remove the protruding particles, the surface is thinly oxidized into a silicon oxide film and is then etched, or the surface is obliquely sputtered.

Figure 3:
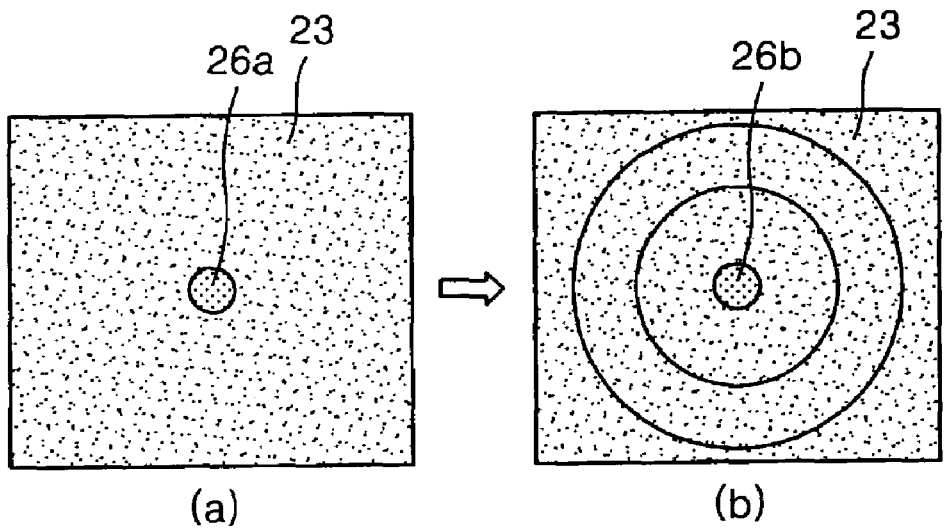
FIG. 3 illustrates a plan view of amorphous silicon before and after use of the method of crystallizing amorphous silicon according to an embodiment of the present invention.

Referring now to FIG. 3, when a nanoparticle 26a acts as a crystal seed, a grain is formed centering on a nanoparticle 26b. Particularly, when a nanoparticle formed of monocrystalline silicon acts as a crystal seed, FIG. 3(a) shows the nanoparticle 26a that just reaches the surface of a amorphous silicon layer 23 after laser radiation has been completed. FIG. 3(b) shows a state in which a ring-shaped grain is formed centering on the nanoparticle 26b when the amorphous silicon layer 23 is cooled.

Figure 4:
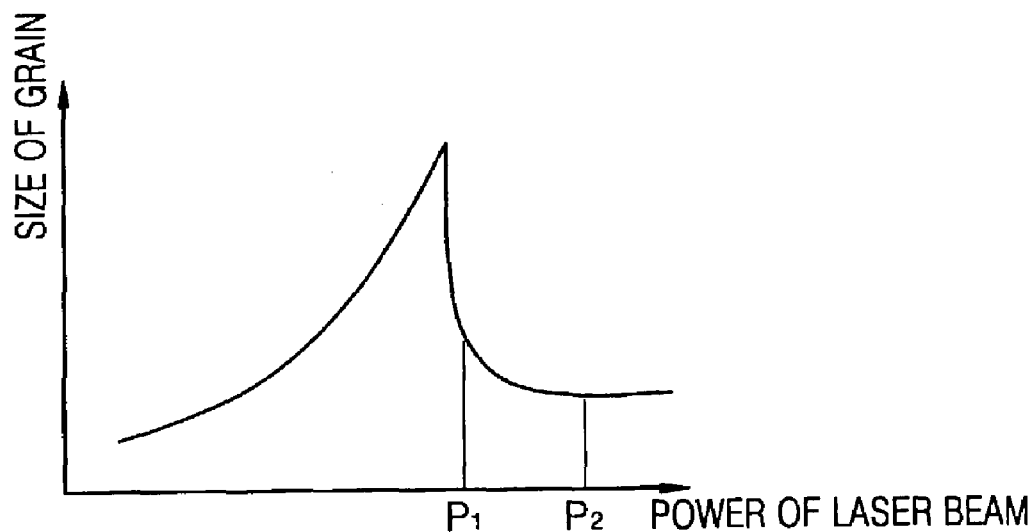
FIG. 4 is a graph of the size of a grain versus the power of a laser beam in the method of crystallizing amorphous silicon according to an embodiment of the present invention.

FIG. 4 is a graph of the size of a grain versus the power of a laser beam in the method of crystallizing amorphous silicon according to an embodiment of the present invention.

In conventional laser annealing technology, it is necessary to maximize the size of a grain by appropriately melting an amorphous silicon layer so that a small amount of amorphous silicon remains using the power of a laser beam near $P_1$. However, since it is difficult to adjust the power of a laser beam, the expected effect is not easily obtained.

However, in a method of crystallizing amorphous silicon using nanoparticles according to an embodiment of the present invention, even if a laser beam having a power of $P_2$ is radiated, thereby completely melting an amorphous silicon layer, nanoparticles, which reach the surface of the amorphous silicon layer that is being cooled after laser radiation has been completed, are able to act as crystal seeds so that the size of a grain can be maximized without significant dependence on the power of the laser beam.

According to the present invention, by externally supplying nanoparticles, the number, size and landing positions of nanoparticles may be controlled without depending on the power of a laser beam. Thus, large and uniform grains can be obtained.

As described above, in the present invention, amorphous silicon is crystallized by melting and cooling while supplying externally formed nanoparticles as crystal seeds, thereby simplifying processes and controlling the size, position and arrangement of crystals.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, it will be understood by those skilled in the art that various kinds of nanoparticles having various sizes may be supplied using various methods of forming nanoparticles without departing from the spirit of the invention.

What is claimed is:

1. A method of crystallizing amorphous silicon, comprising:

supplying seed particles over an exposed surface of an amorphous silicon layer;

intermittently melting a portion of the amorphous silicon layer and seed particles that reach the surface of the amorphous silicon layer using a light beam while supplying the seed particles; and cooling the amorphous silicon layer to grow crystals using unmolten seed particles as crystal seeds, thereby forming a polysilicon layer from the amorphous silicon layer.

2. The method as claimed in claim 1, wherein the melting comprises intermittently melting the amorphous silicon layer by radiating a laser beam having a pulse waveform at the amorphous silicon layer.

3. The method as claimed in claim 1, wherein the crystals have a ring-shape and are centered around the crystal seeds.

4. The method as claimed in claim 1, further comprising:
removing seed particles that protrude from the surface of the polysilicon layer.

5. The method as claimed in claim 2, further comprising:
removing seed particles that protrude from the surface of the amorphous silicon layer after cooling the amorphous silicon layer.

6. The method as claimed in claim 4, wherein the removing of seed particles comprises oxidizing the seed particles and the surface of the polysilicon layer and etching them.

7. The method as claimed in claim 5, wherein the removing of seed particles comprises oxidizing the seed particles and the surface of the polysilicon layer and etching them.

8. The method as claimed in claim 4, wherein the removing of seed particles comprises performing sputtering on the surface of the polysilicon layer.

9. The method as claimed in claim 5, wherein the removing of seed particles comprises performing sputtering on the surface of the polysilicon layer.

10. The method as claimed in claim 1, wherein the amorphous silicon layer has an initial thickness of between several angstroms and several thousand angstroms.

11. The method as claimed in claim 10, wherein the thickness of the amorphous silicon layer is about 1000 Å.

12. The method as claimed in claim 1, wherein a carrier gas for the seed particles includes one or more of helium, nitrogen and argon.

13. The method as claimed in claim 1, wherein the seed particles have a size of less than several hundreds of nanometers.

14. The method as claimed in claim 13, wherein the seed particles have a size of several nanometers to several tens of nanometers.

15. The method as claimed in claim 1, wherein the seed particles are silicon monocrystals.

16. The method as claimed in claim 1, wherein the amorphous silicon layer is formed on a substrate, such that a first surface of the amorphous silicon layer is exposed and a second surface, opposite to the first surface, faces the substrate, and the seed particles are supplied to the first surface of the amorphous silicon layer.

17. The method as claimed in claim 16, wherein the substrate is glass.

18. The method as claimed in claim 16, wherein the substrate is plastic.

19. The method as claimed in claim 16, wherein the intermittent melting melts an entire thickness of the amorphous silicon layer.

20. The method as claimed in claim 16, wherein growth of the crystals commences at the first surface and progresses towards the second surface.

21. The method as claimed in claim 1, further comprising generating the seed particles from a material having a size greater than the seed particles.

22. The method as claimed in claim 21, wherein the generating is continued at least until the supplying commences.

23. The method as claimed in claim 22, wherein the generating is continued at least until the cooling commences.

24. The method as claimed in claim 21, wherein generating the seed particles includes laser ablation of a material using a laser, and the laser is used for the laser ablation of the material and the intermittent melting of the amorphous silicon layer.

25. The method as claimed in claim 1, wherein the intermittent melting includes at least one melting cycle, and the seed particles are supplied before, during and after the at least one melting cycle.

* * * * *